(12) United States Patent
Koontz et al.

(10) Patent No.: US 10,401,099 B2
(45) Date of Patent: Sep. 3, 2019

(54) TRANSPARENT HEAT EXCHANGER

(71) Applicant: Raytheon Company, Waltham, MA (US)

(72) Inventors: Christopher R. Koontz, Manhattan Beach, CA (US); David Filgas, Newbury Park, CA (US)

(73) Assignee: Raytheon Company, Waltham, MA (US)

( * ) Notice: Subject to any disclaimer, the term of this patent is extended or adjusted under 35 U.S.C. 154(b) by 115 days.

(21) Appl. No.: 15/285,867

(22) Filed: Oct. 5, 2016

(65) Prior Publication Data

US 2018/0094882 A1 Apr. 5, 2018

(51) Int. Cl.
| | |
|---|---|
| *F28F 21/00* | (2006.01) |
| *F28F 21/02* | (2006.01) |
| *F28F 21/04* | (2006.01) |
| *F28F 21/08* | (2006.01) |
| *F28F 3/02* | (2006.01) |
| *H01S 3/04* | (2006.01) |
| *G02B 7/18* | (2006.01) |
| *H01S 5/024* | (2006.01) |
| *G02B 7/00* | (2006.01) |
| *H01S 3/23* | (2006.01) |

(52) U.S. Cl.
CPC ............... *F28F 21/00* (2013.01); *F28F 3/02* (2013.01); *F28F 21/02* (2013.01); *F28F 21/04* (2013.01); *F28F 21/081* (2013.01); *G02B 7/008* (2013.01); *G02B 7/1815* (2013.01); *H01S 3/0407* (2013.01); *H01S 5/02423* (2013.01); *F28F 21/006* (2013.01); *F28F 2255/00* (2013.01); *H01S 3/0401* (2013.01); *H01S 3/0405* (2013.01); *H01S 3/2308* (2013.01); *H01S 5/02438* (2013.01); *H01S 5/02476* (2013.01)

(58) Field of Classification Search
CPC .......... F28F 21/02; F28F 21/04; F28F 21/006; F28F 3/02; F28F 2255/00; G02B 7/1815; H01S 3/0401; H01S 3/0405
USPC ........................................................ 165/185
See application file for complete search history.

(56) References Cited

U.S. PATENT DOCUMENTS

| | | | |
|---|---|---|---|
| 5,726,751 | A | 3/1998 | Altendorf et al. |
| 5,785,874 | A | 7/1998 | Eda |
| 5,796,766 | A | 8/1998 | Hargis et al. |
| 6,284,085 | B1 | 9/2001 | Gwo |
| 6,339,605 | B1 * | 1/2002 | Vetrovec ................. H01S 3/025 359/333 |
| 6,480,515 | B1 | 11/2002 | Wilson |
| 6,690,696 | B2 | 2/2004 | Byren et al. |
| 6,859,472 | B2 | 2/2005 | Betin et al. |

(Continued)

OTHER PUBLICATIONS

U.S. Appl. No. 14/661,828, filed Mar. 18, 2015, Filgas et al.

(Continued)

*Primary Examiner* — Joel M Attey
(74) *Attorney, Agent, or Firm* — Daly, Crowley, Mofford & Durkee, LLP

(57) ABSTRACT

In one aspect, a transparent heat exchanger includes a first transparent substrate optically attached to a heat source, one or more fins to transfer heat from the heat source, the one or more fins comprising transparent material and further comprising one of a manifold coupled to the first transparent substrate or a facesheet coupled to the first transparent material.

11 Claims, 14 Drawing Sheets

(56) References Cited

U.S. PATENT DOCUMENTS

| | | | |
|---|---|---|---|
| 7,472,741 B2 | 1/2009 | Johnson et al. | |
| 8,921,992 B2 | 12/2014 | Koontz et al. | |
| 9,502,330 B1 * | 11/2016 | Gupta | H01L 23/473 |
| 2002/0110164 A1 * | 8/2002 | Vetrovec | H01S 3/042 |
| | | | 372/36 |
| 2011/0067803 A1 | 3/2011 | Tong et al. | |
| 2014/0123578 A1 | 5/2014 | Ingber et al. | |

OTHER PUBLICATIONS

U.S. Appl. No. 14/734,372, filed Jun. 9, 2015, Gupta et al.
Hatton et al., "An Artificial Vasculature for Adaptive Thermal Control of Windows;" Article from *Solar Energy Materials & Solar Cells*, vol. 117; Oct. 2013; pp. 429-436; 8 Pages.
Merrigan et al., "Tokamak Physics Experiment: Diagnostic Window Study;" Technical Report; Los Alamos National Laboratory; Aug. 28, 1995; 11 Pages.
PCT International Search Report and Written Opinion dated Aug. 3, 2017 for International Application No. PCT/US2017/031186; 20 Pages.
Culpepper et al.; "Liquid-Cooled Transmissive Optical Component;" Proceedings of SPIE Conference on Advances in Mirror Technology for Synchroton X-Ray and Laser Applications; San Diego, California; vol. 3447; Jul. 1998; 8 Pages.
Vetrovec; "Active Mirror Amplifier for High-Average Power;" Proceedings of SPIE; vol. 4270; 2001; 12 Pages.
PCT International Preliminary Report dated Apr. 18, 2019 for International Application No. PCT/US2017/031186; 11 Pages.

\* cited by examiner

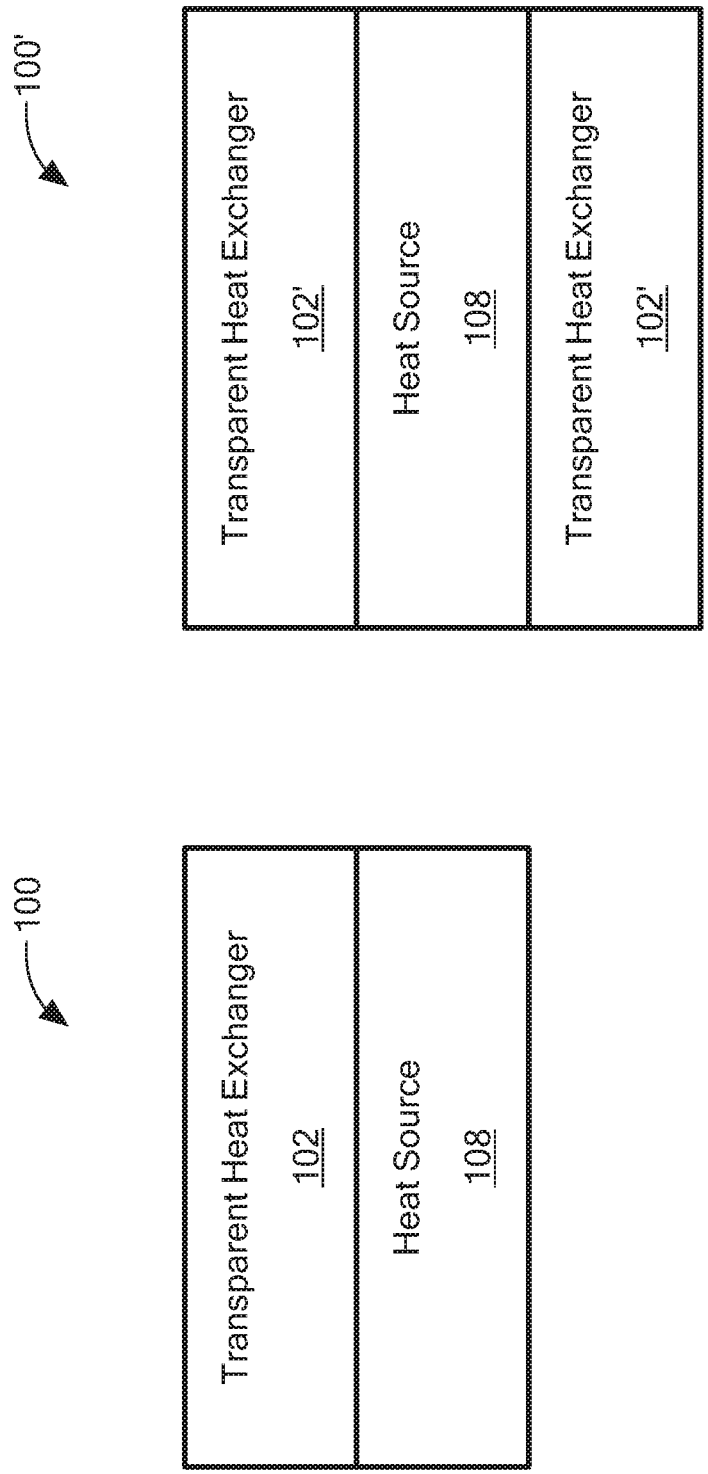

TRANSPARENT HEAT EXCHANGER

BACKGROUND

Some electro-optical devices such as laser gain media, for example, generate a significant amount of heat that must be removed efficiently to avoid damage to the electro-optical devices or reduce their performance. In order to cool the electro-optical devices, heat exchangers (sometimes called heatsinks) are sometimes used to transfer the heat away from the electro-optical devices. In some examples, the heat exchangers transfer the heat to a fluid in motion.

SUMMARY

In one aspect, a transparent heat exchanger includes a first transparent substrate optically attached to a heat source, one or more fins to transfer heat from the heat source, the one or more fins comprising transparent material and further comprising one of a manifold coupled to the first transparent substrate or a facesheet coupled to the first transparent material.

In another aspect, an optical window includes a first transparent substrate and a second transparent substrate optically bounded to the first transparent substrate and comprising one or more fins.

In a further aspect, a method to fabricate a transparent heat exchanger includes optically bonding a first transparent substrate to a heat source; forming one or more fins to transfer heat from the heat source, and coupling the first transparent substrate to one of a manifold or a facesheet. The one or more fins includes transparent material.

DESCRIPTION OF THE DRAWINGS

FIG. 1 is a block diagram of an example of a configuration of transparent heat exchanger system.

FIG. 2 is a block diagram of another example of a configuration of transparent heat exchanger system.

DETAILED DESCRIPTION

Figure 3:
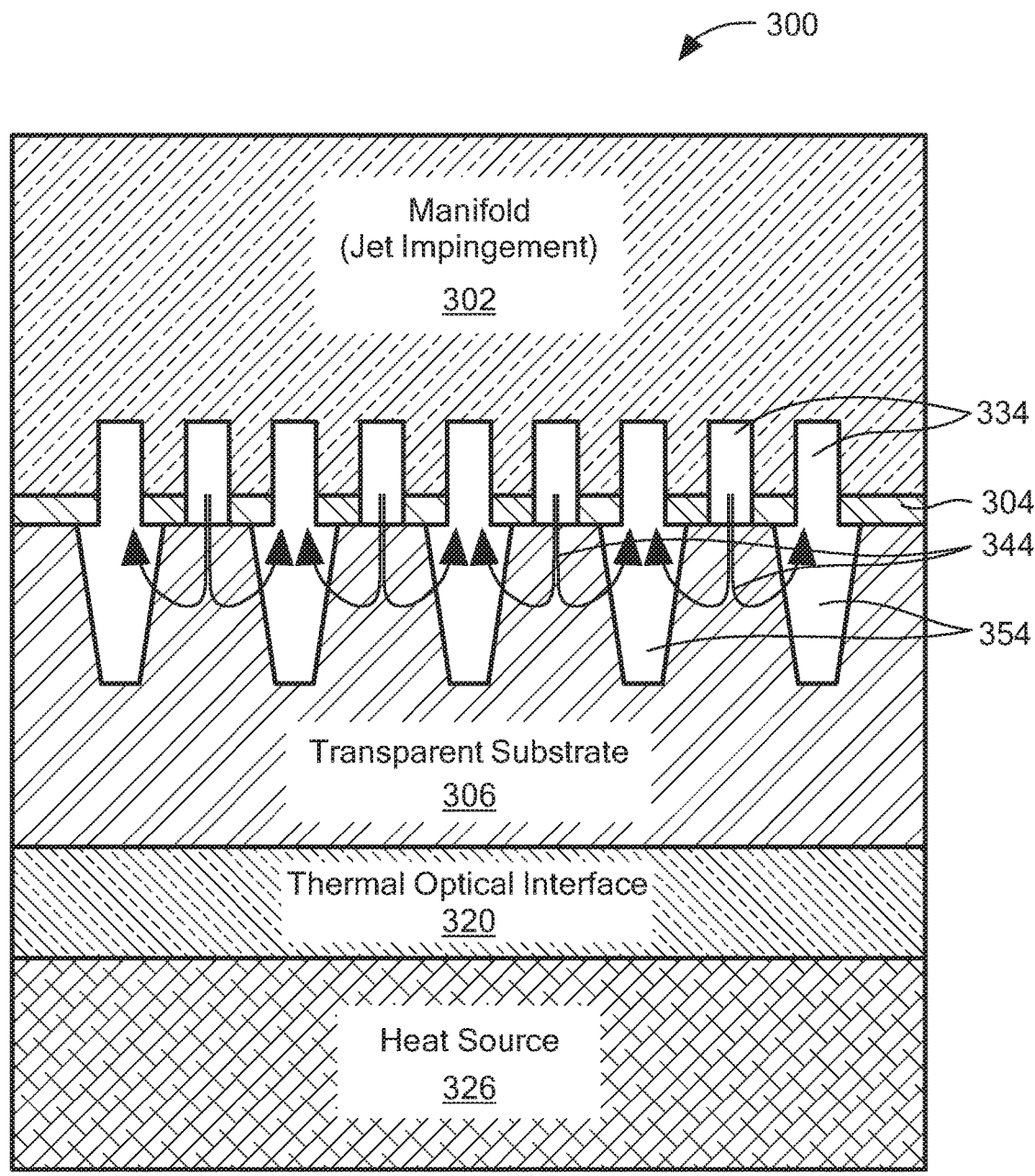
FIG. 3 is a cross-sectional diagram of an example of a transparent heat exchanger system.

Described herein are transparent heat exchangers. In one example, a transparent heat exchanger may include a transparent substrate with one or more fins. In another example, a transparent heat exchanger may include more than one transparent substrate. In a further example, a transparent heat exchanger forming an optical window may include transparent substrates with at least one substrate having one or more fins.

As used herein the term "transparent" refers to a material's ability to allow wavelengths of light (e.g., visible or infrared), or at least wavelengths of light above or below a particular wavelength, to pass through the material. As used herein transparent material includes semi-transparent material and fully transparent material.

As used herein, the term "transparent heat exchanger" may be used interchangeably with the term "transparent heatsink."

Some energy sources generate both thermal energy (sensible heat) and light energy (such as fluorescence, stray pump light, and/or signal light). With prior art (non-transparent heat exchangers), the light energy is converted into thermal energy at the interface between the source and the heat exchanger. The aggregated thermal energy and the newly converted light energy must conduct through the heat exchanger along the same path and into the coolant on the same surfaces. As described herein, the transparent heat exchanger enables improved thermal performance by separating the functions of removing waste heat generated in the source and waste heat generated by light energy emanating from the source. The light emanating from the source may be converted into heat within the bulk coolant, on separate heat exchanger surfaces from those conducting the waste heat, and/or the light may pass completely through the heat exchanger. All cases result in greater heat exchanger performance due to lower heat per unit area of the heat exchanger facesheet and lower heat per unit area at the heat exchanger interface with the coolant.

FIG. 1 depicts one example of a transparent heat exchanger system 100. The transparent heat exchanger system 100 includes a transparent heat exchanger 102 that is attached to a heat source 108 and is configured to remove heat from the heat source. In this configuration the transparent heat exchanger 102 is attached to one side of the heat source.

FIG. 2 depicts a transparent heat exchanger system 100' in cross-section. The heat exchanger system 100' includes the transparent heat exchanger 102' that at least partially surrounds the heat source 108 and is configured to remove heat from the heat source 108.

In one particular example, the heat source 108 is a laser system (e.g., a laser amplifier). In another example, the heat source 108 is a mirror. In a further example, the heat source 108 is a lens.

As will be further described herein the transparent heat exchangers 102, 102' each include at least one transparent substrate and further include at least one of fins formed from transparent material or fluid channels for jet impingement to transfer heat.

Referring to FIG. 3, a transparent heat exchanger system 300, in one example, includes a manifold 302, a first thermal optical interface 304, a transparent substrate 306, a second thermal optical interface 320 and a heat source 326 (e.g., a laser amplifier). The manifold 302 includes fluid channels (e.g., fluid channels 334) used for jet impingement of a fluid (e.g., coolant) to provide cooling. In some examples herein, a thermal optical interface may be an optical bond that is able to transmit light of a desired wavelength. In some examples herein, a thermal optical interface may be a thin film of fluid. As used herein, a thermal optical interface is an interface that passes both thermal and optical energy thru the interface The transparent substrate 306 includes etched troughs (e.g., fluid channels 354 to carry coolant), which form raised features in the transparent substrate 306 called fins (e.g., fins 344). The fins 344 provide an increased heat transfer area. In one example, the transparent substrate 306 is one of indium phosphate, silicon, silicon carbide, fused silica, sapphire, diamond or any other suitable material or combination of materials. In one example, a coefficient of thermal expansion (CTE) of the transparent substrate 306 is about equal to the CTE of the heat source 326 (e.g., differing by no more than 10 parts per million per degree Centigrade (ppm/° C.)).

In other examples, the manifold 334 may be along one or both ends of the transparent substrate 306 instead, or the manifold 334 may partially or wholly surround the transparent substrate 306.

Figure 4:
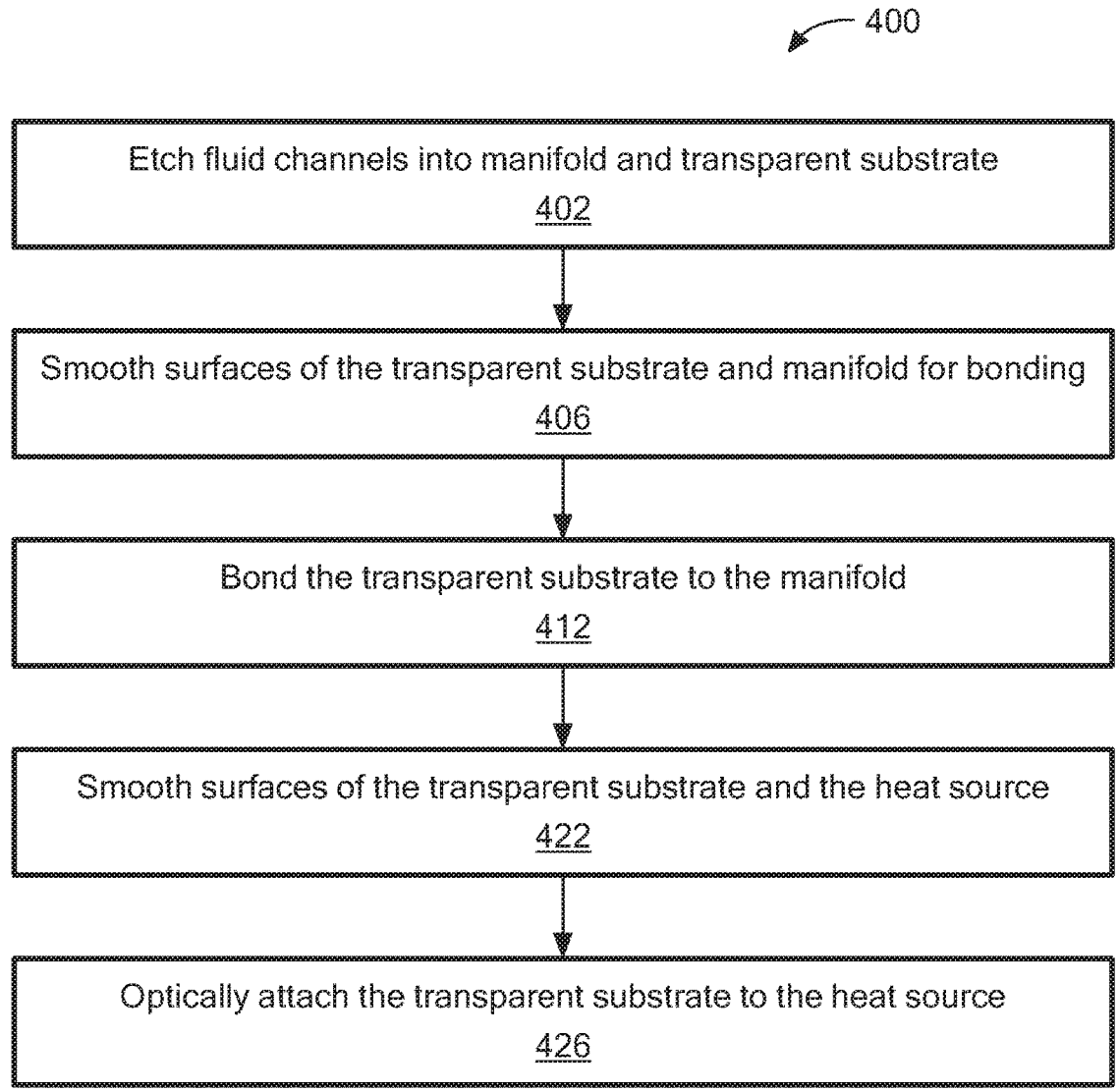
FIG. 4 is a flowchart of an example of a process to fabricate the transparent heat exchanger system of FIG. 2.

Referring to FIG. 4, a process 400 is one example of a process to fabricate the heat exchanger system 300. The fluid channels 334 are etched in the manifold 302 and fluid channels 354 are etched into the transparent substrate 306 (402). Surfaces of transparent substrate 306 and the manifold 302 are smoothed for optical bonding (406). The transparent substrate 306 is bonded to the manifold 302 with thermal optical interface 304 to form a bonded assembly (412). The surfaces of transparent substrate 306 and the heat source 326 are smoothed (422). The transparent substrate 306 is optically attached (i.e., forming a thermal optical interface that passes thermal and optical energy through the interface) to the heat source 326 with thermal optical interface 324 (426). It should be understood that both surfaces of transparent substrate 306 may be smoothed at the same step.

In one or more embodiments described herein, various techniques may be used to form a smooth surface. For example, chemical or mechanical planarization of a surface may be accomplished to produce a smooth surface by polishing, etching, or a combination of the two. In some embodiments, the surface may be smoothed by exposing the surface to an abrasive and/or corrosive chemical in conjunction with a polishing pad that is in contact with the surface and is moved relative to the surface. In some embodiments, the surfaces may be smoothed to a surface roughness of less than 25 Angstroms (e.g., between 10 to 25 Angstroms, 5 to 10 Angstroms, less than 5 Angstroms).

In one or more embodiments described herein, a typical flatness for optics (bonded or unbonded) may be 10% of the wavelength (referred to as lambda/10). In one particular example, for a 1 micrometer wavelength, the flatness of the optics is 100 nm.

Figure 5:
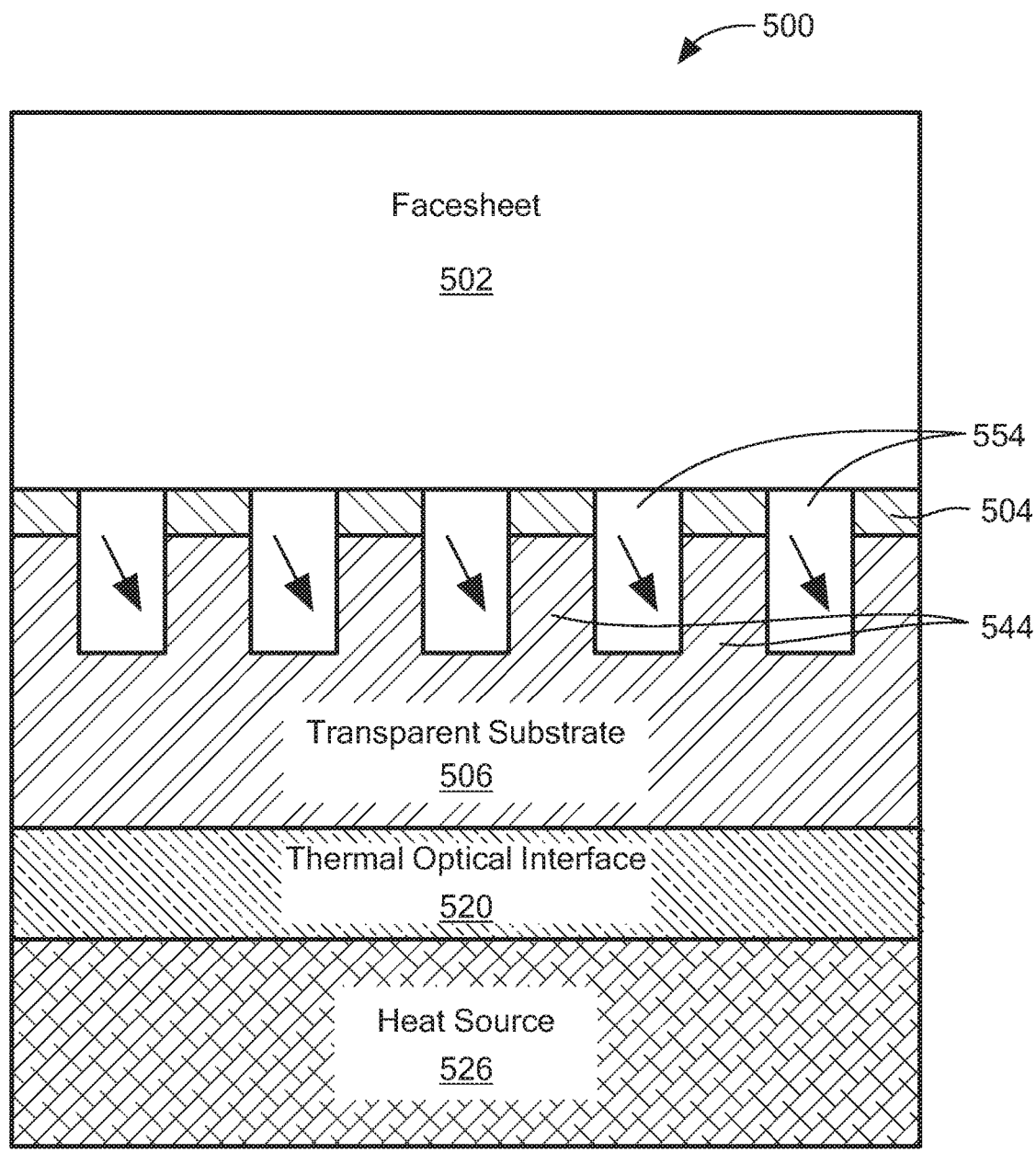
FIG. 5 is a cross-sectional diagram of another example of a transparent heat exchanger system.

Referring to FIG. 5, a heat exchanger system 500, in one example, includes a facesheet 502, a first thermal optical interface 504, a transparent substrate 506, a second thermal optical interface 520 and a heat source 526 (e.g., a laser amplifier).

The transparent substrate 506 includes etched troughs (e.g., fluid channels 554 to carry coolant), which form raised features in the transparent substrate 506 called fins (e.g., fins 544). The fins 544 provide an increased heat transfer area. In one example, the transparent substrate 506 is one of indium phosphate, silicon, silicon carbide, fused silica, sapphire, diamond, germanium, zinc selenide, zinc sulfide or any other suitable material or combination of materials. In one example, a CTE of the transparent substrate 506 is about equal to the CTE of the heat source 526.

In other examples, the facesheet 502 may be along one or both ends of the transparent substrate 506 instead, or the facesheet 502 may partially or wholly surround the transparent substrate 506.

Figure 6:
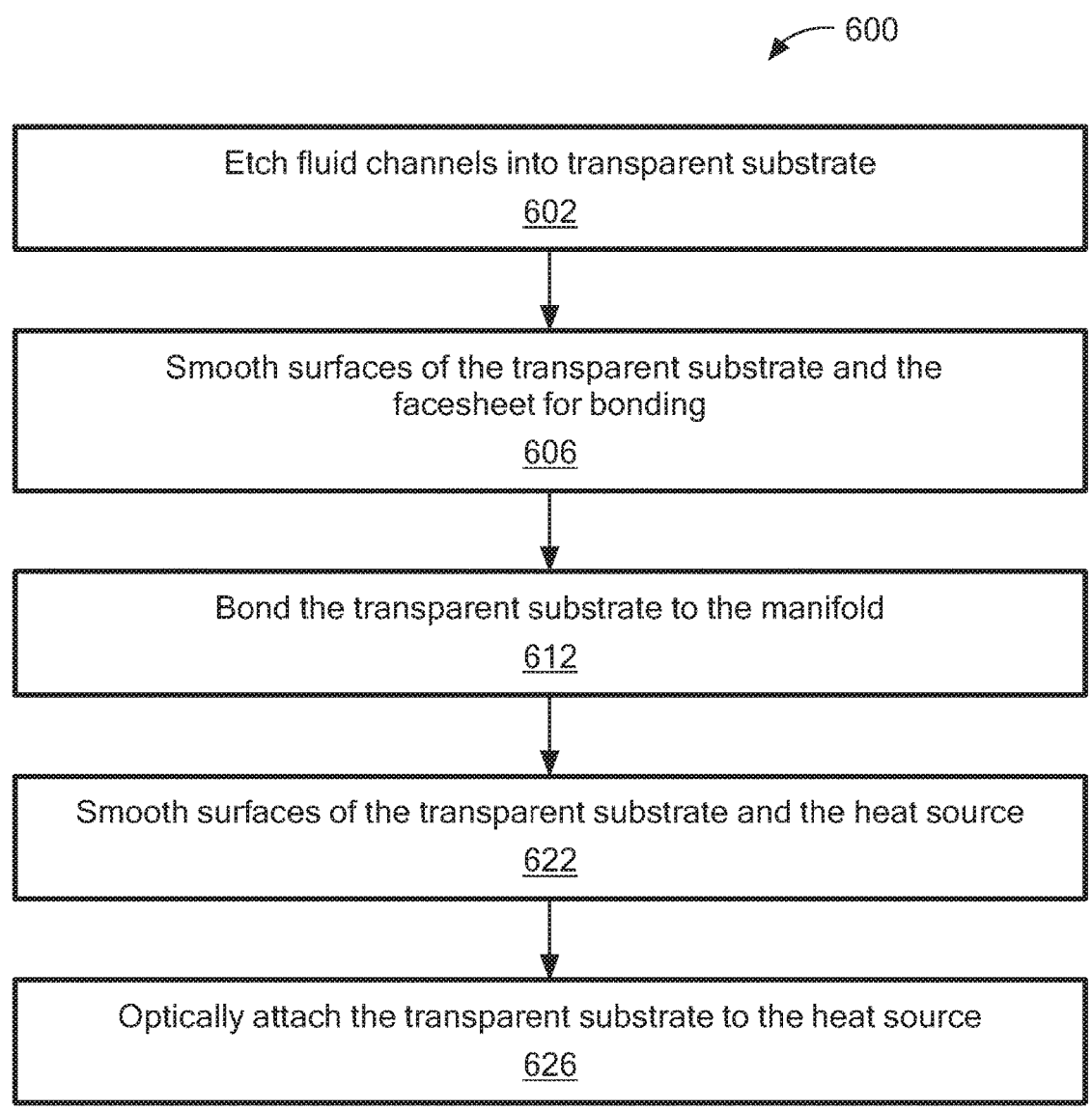
FIG. 6 is a flowchart of an example of a process to fabricate the transparent heat exchanger system of FIG. 5.

Referring to FIG. 6, a process 600 is one example of a process to fabricate the heat exchanger system 500. The fluid channels 554 are etched into the transparent substrate 506 (602). Surfaces of transparent substrate 506 and the facesheet 502 are smoothed for optical bonding (606). The transparent substrate 506 is bonded to the facesheet 502 with thermal optical interface 504 to form a bonded assembly (612). The surfaces of transparent substrate 506 and the heat source 526 are smoothed (622). The transparent substrate 506 is optically attached to the heat source 526 with thermal optical interface 520 (626). In one example, it should be understood that both surfaces of transparent substrate 506 may be smoothed at the same time.

Figure 7:
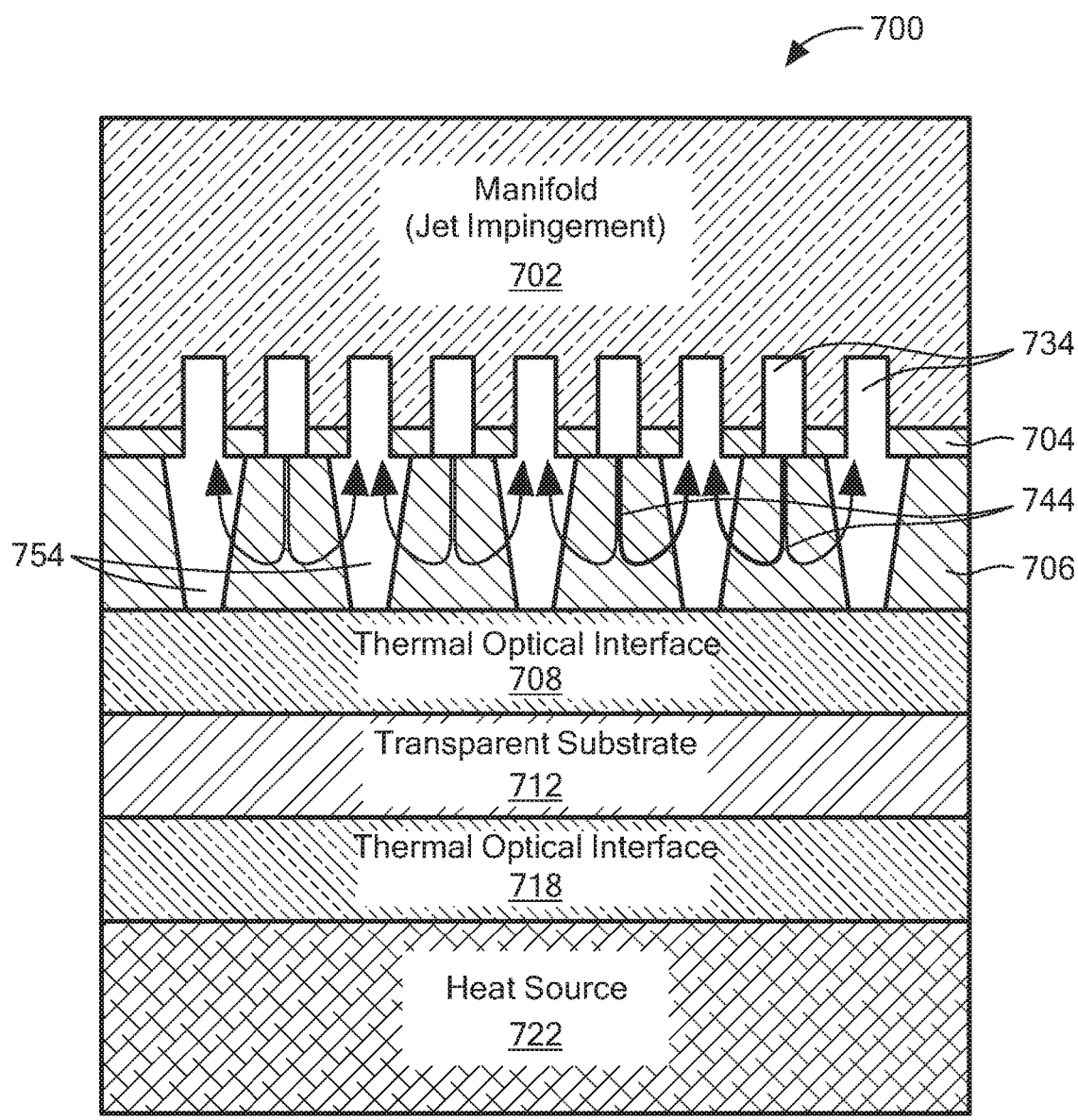
FIG. 7 is a cross-sectional diagram of a further example of a transparent heat exchanger system.

Referring to FIG. 7, a transparent heat exchanger system 700, in one example, includes a manifold 702, a first thermal optical interface 704, a first transparent substrate 706, a second thermal optical interface 708, a second transparent substrate 712 (sometimes called a "transparent facesheet substrate" in this configuration), a third thermal optical interface 718 and a heat source 722 (e.g., a laser amplifier). The manifold 702 includes fluid channels (e.g., fluid channels 734) used for jet impingement of a fluid (e.g., coolant) to provide cooling.

The first transparent substrate 706 includes etched troughs (e.g., fluid channels 754 to carry coolant), which form raised features in the first transparent substrate 706 called fins (e.g., fins 744). The fins 744 provide an increased heat transfer area. In one example, the first transparent substrate 706 and the second transparent substrate 712 are each one of indium phosphate, silicon, silicon carbide, fused silica, sapphire, diamond, or any other suitable material or combination of materials. The first transparent material 706 and the second transparent material 712 may be the same or different material. The coefficient of thermal expansion (CTE) of the first transparent substrate 706, the CTE of the second transparent substrate and the CTE of the heat source 722 are about equal (e.g., the CTEs of the first transparent substrate, the second transparent substrate and the heat source differ by no more than 10 parts per million per degree Centigrade (ppm/° C.) from each other. In some examples, the second transparent substrate 712 may be configured to include etched troughs. In some examples, the second transparent substrate 712 may be configured to include etched troughs instead of the first transparent substrate 706.

Figure 8:
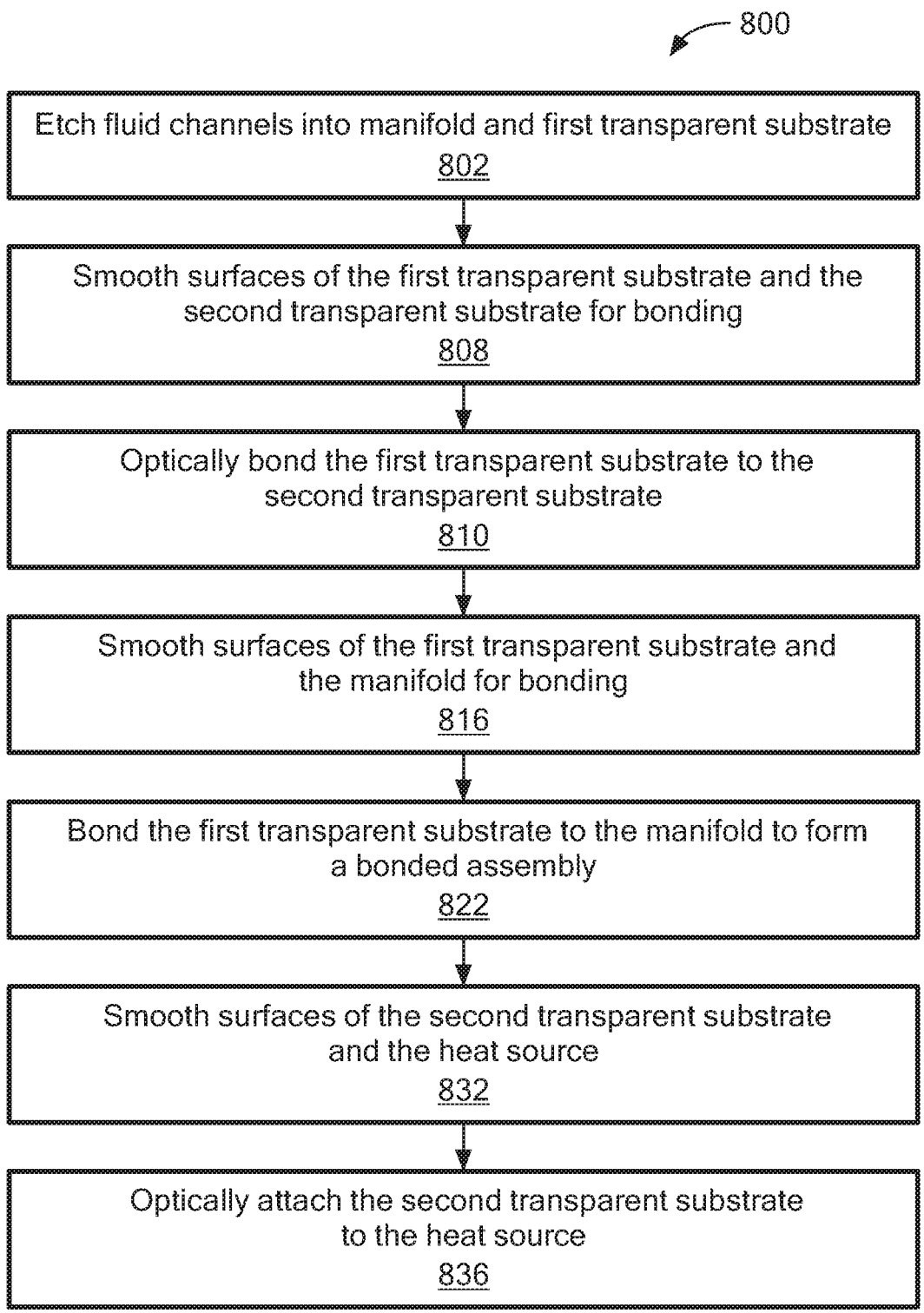
FIG. 8 is a flowchart of an example of a process to fabricate the transparent heat exchanger system of FIG. 7.

Referring to FIG. 8, a process 800 is one example of a process to fabricate the heat exchanger system 700. The fluid channels 734 are etched in the manifold 702 and fluid channels 754 are etched into the first transparent substrate 706 (802). Surfaces of the first transparent substrate 706 and the second transparent substrate 712 are smoothed for optical bonding (808). The first transparent substrate 706 is optically bonded to the second transparent substrate 712 with thermal optical interface 708 (810). Surfaces of the first transparent substrate 706 and the manifold 702 are smoothed for optical bonding (816). The first transparent substrate 706 is bonded to the manifold 702 with thermal optical interface 704 to form a bonded assembly (822). It should be understood that both surfaces of the first transparent substrate 706 may be smoothed at the same step.

The surfaces of the second transparent substrate 712 and the heat source 722 are smoothed (832). The second transparent substrate 712 is optically attached to the heat source 722 with thermal optical interface 718 (836). It should be understood that both surfaces of the second transparent substrate 712 may be smoothed at the same step.

Figure 9:
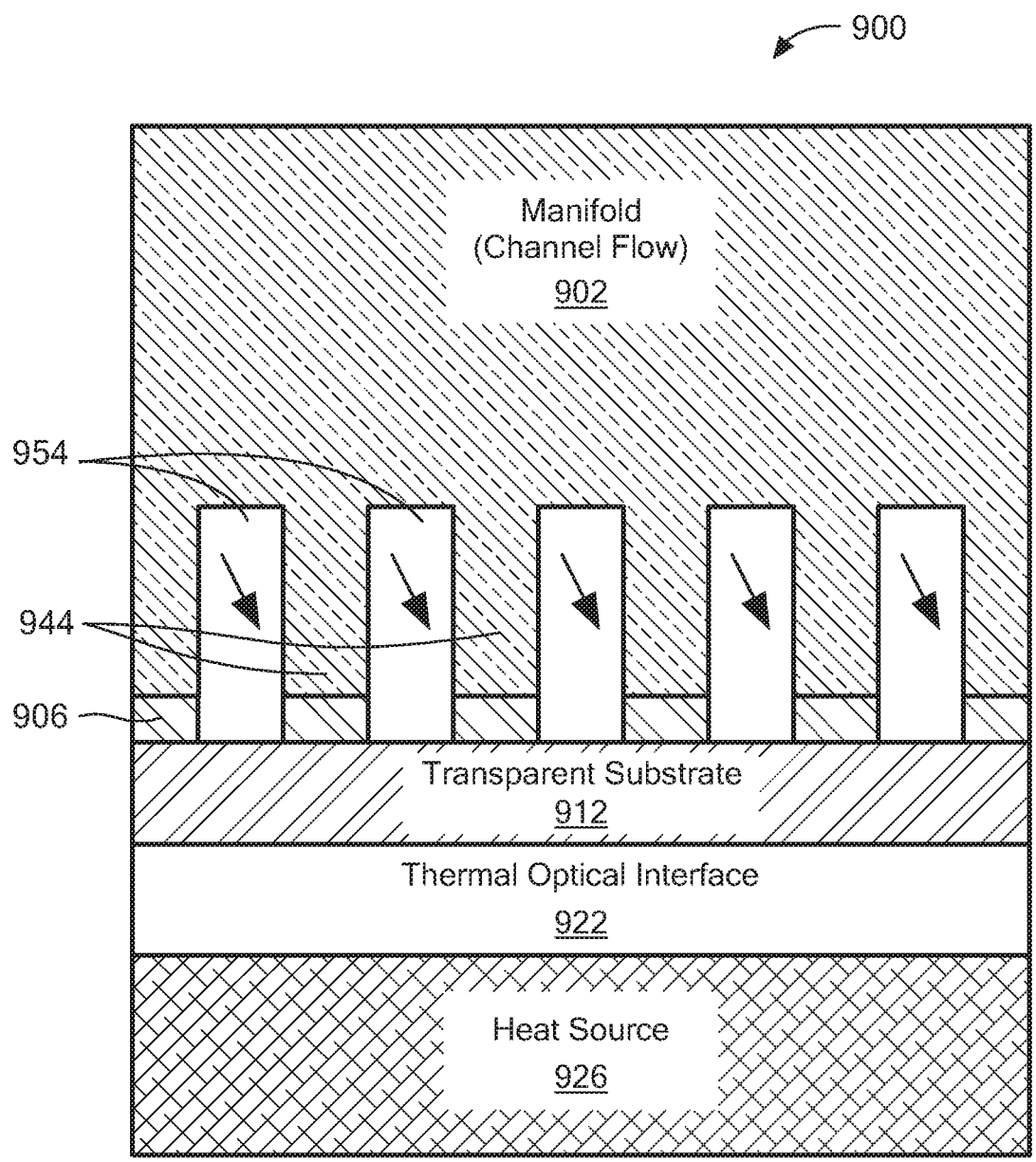
FIG. 9 is a cross-sectional diagram of a still further example of a transparent heat exchanger system.

Referring to FIG. 9, a transparent heat exchanger system 900, in one example, includes a manifold 902, a first thermal optical interface 906, a transparent substrate 912, a second thermal optical interface 922 and a heat source 926 (e.g., a laser amplifier). The manifold 902 includes etched troughs (e.g., fluid channels 954), which form features in the manifold 902 called fins (e.g., fins 944). The fins 944 provide an increased heat transfer area.

In one example, the manifold 902 is a transparent material being one of indium phosphate, silicon, silicon carbide, fused silica, sapphire, diamond, or any other suitable material or combination of materials. In one example, the transparent substrate 912 is one of indium phosphate, silicon, silicon carbide, fused silica, sapphire, diamond, or any other suitable material or combination of materials. In one example, a CTE of the transparent substrate 912 is about equal to the CTE of the heat source 926.

In other examples, the manifold 902 may be along one or both ends of the transparent substrate 912 instead, or the manifold 902 may partially or wholly surround the transparent substrate 912.

Figure 10:
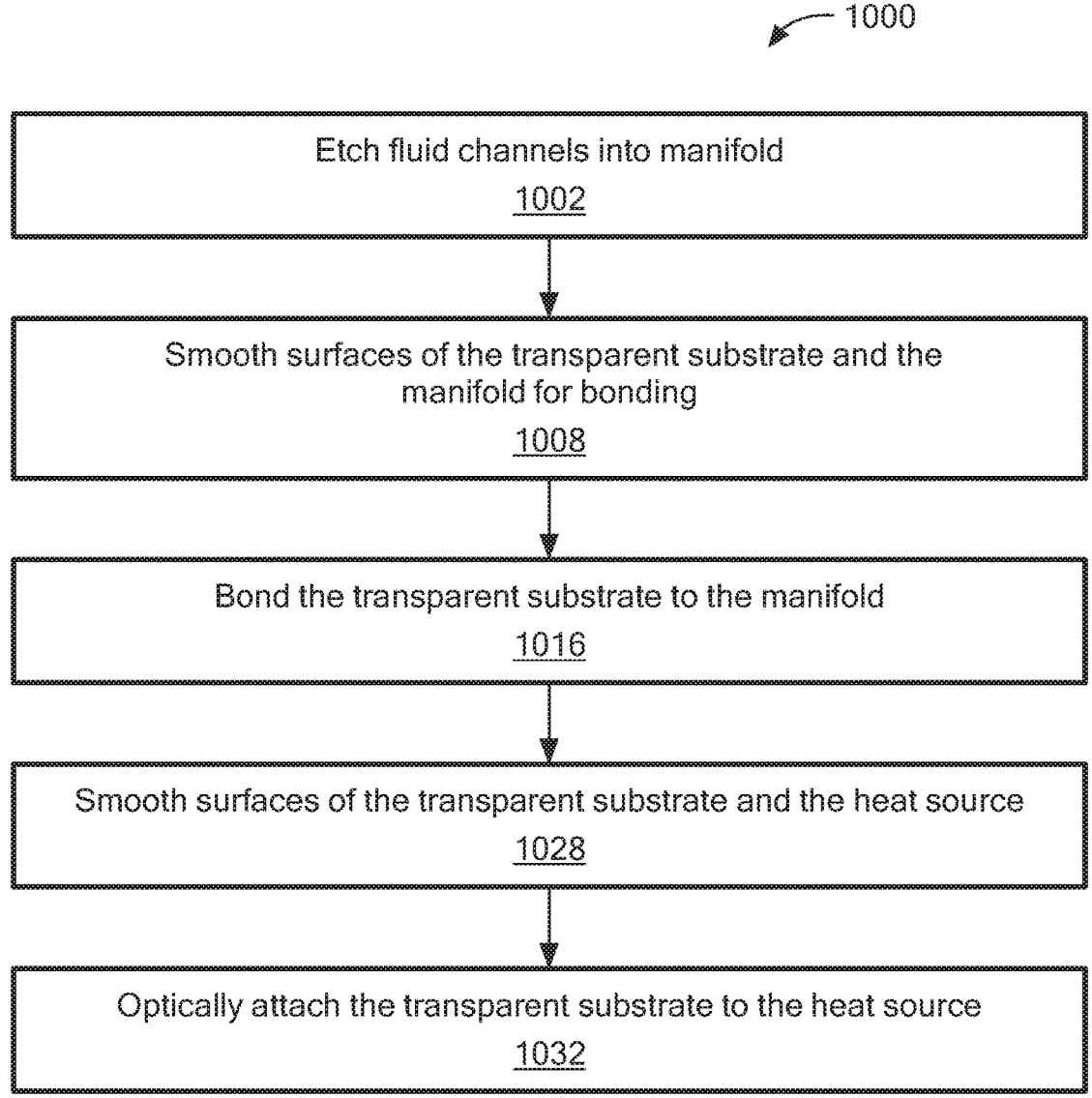
FIG. 10 is a flowchart of an example of a process to fabricate the transparent heat exchanger system of FIG. 9

Referring to FIG. 10, a process 1000 is one example of a process to fabricate the heat exchanger system 900. The fluid channels 954 are etched in the manifold 902 (1002). Surfaces of transparent substrate 912 and the manifold 902 are smoothed for optical bonding (1008). The transparent substrate 912 is optically bonded to the manifold 902 with the first thermal optical interface 906 to form a bonded assembly (1016). The surfaces of transparent substrate 912 and the heat source 926 are smoothed (1028). The transparent substrate 912 is optically attached to the heat source 926 with the second thermal optical interface 922 (1032). It should be understood that both surfaces of the transparent substrate 912 may be smoothed at the same step.

Figure 11A:
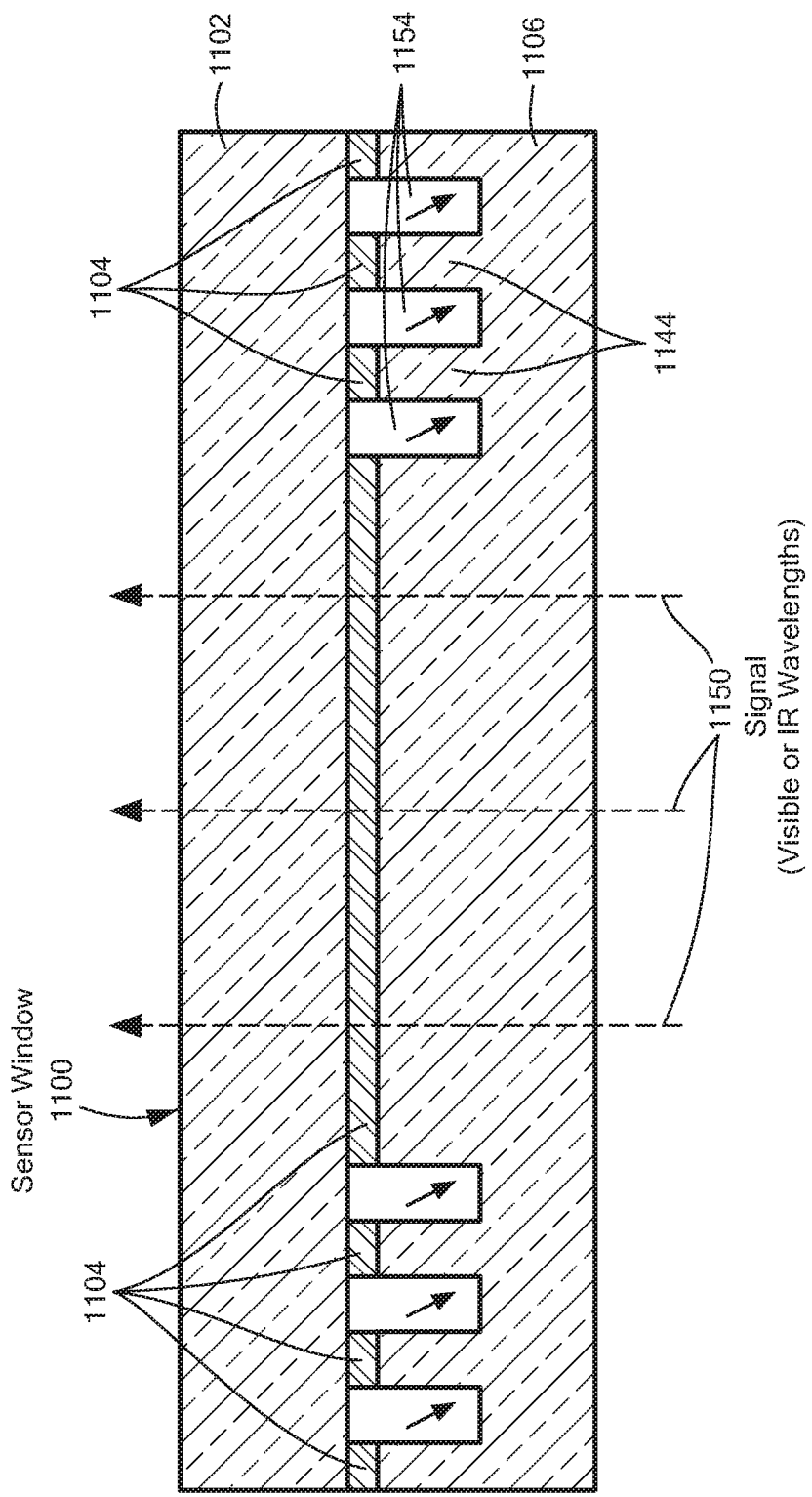
FIG. 11A to 11C are diagrams of examples of a transparent heat exchanger in an optical window.

Referring to FIG. 11A, an optical window 1100 is a transparent heat exchanger that includes a first transparent substrate 1102, a thermal optical interface 1104 and a second transparent substrate 1106. The second transparent substrate 1106 includes etched troughs (e.g., fluid channels 1154), which form features in the second transparent substrate 1106 called fins (e.g., fins 1144). In this configuration, light (e.g., with visible or infrared wavelength 1150) generated by a source (not shown) passes through the window 1100. In one example, the first transparent substrate 1102 includes at least one of indium phosphate, silicon, silicon carbide, fused silica, sapphire, diamond, or any other suitable material or combination of materials. In one example, the second transparent substrate 1106 includes at least one of indium phosphate, silicon, silicon carbide, fused silica, sapphire, diamond, or any other suitable material or combination of materials. In some examples, the first transparent substrate 1102 may be configured to include etched troughs. In some examples, the first transparent substrate 1102 may be configured to include etched troughs instead of the second transparent substrate 1106.

Figure 11B:
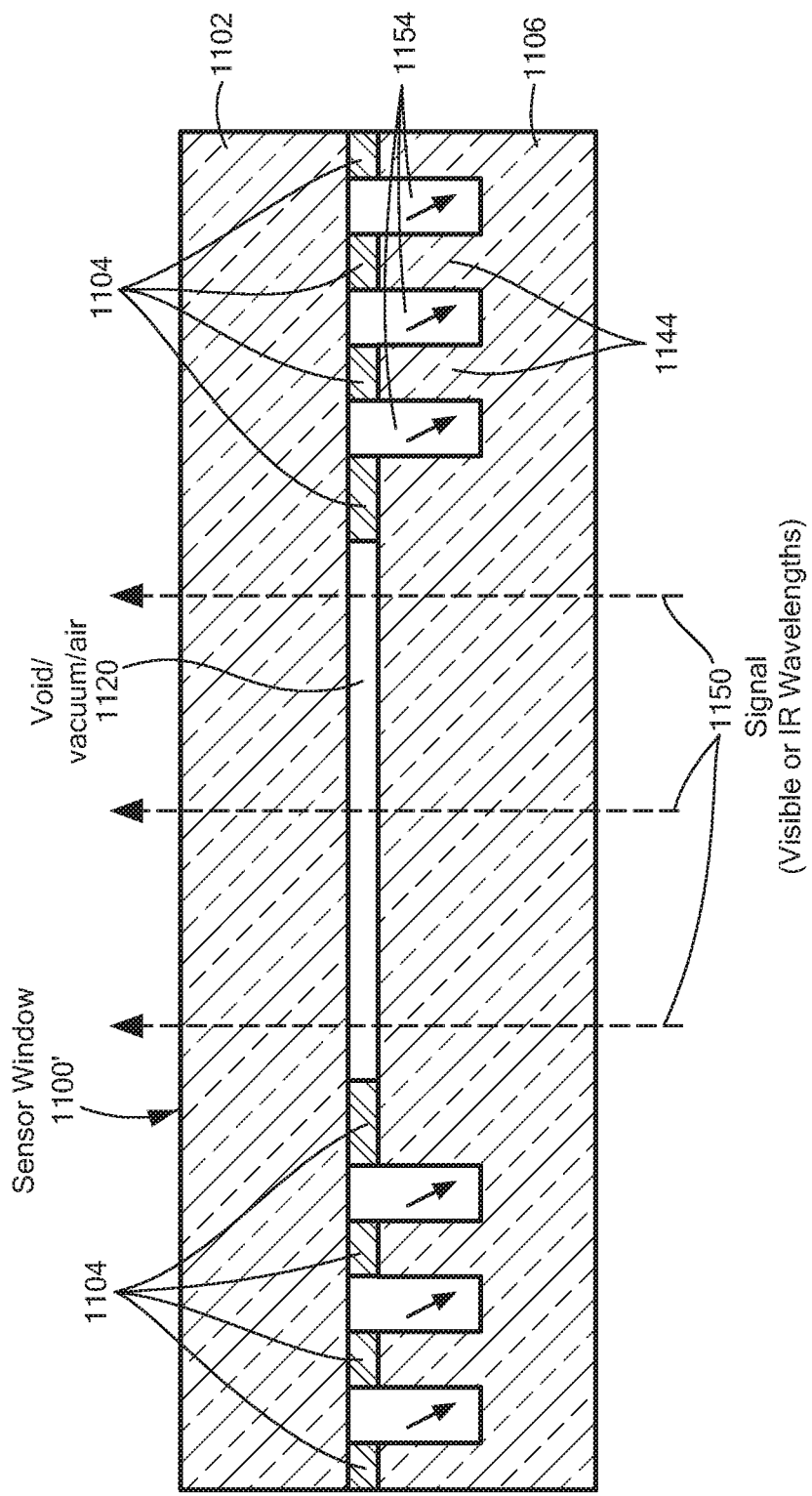

In some examples, a void, vacuum or air gap 1120 may separate the first transparent substrate 1102 from the second transparent substrate 1106 in an optical window 1100' (FIG. 11B).

Figure 11C:
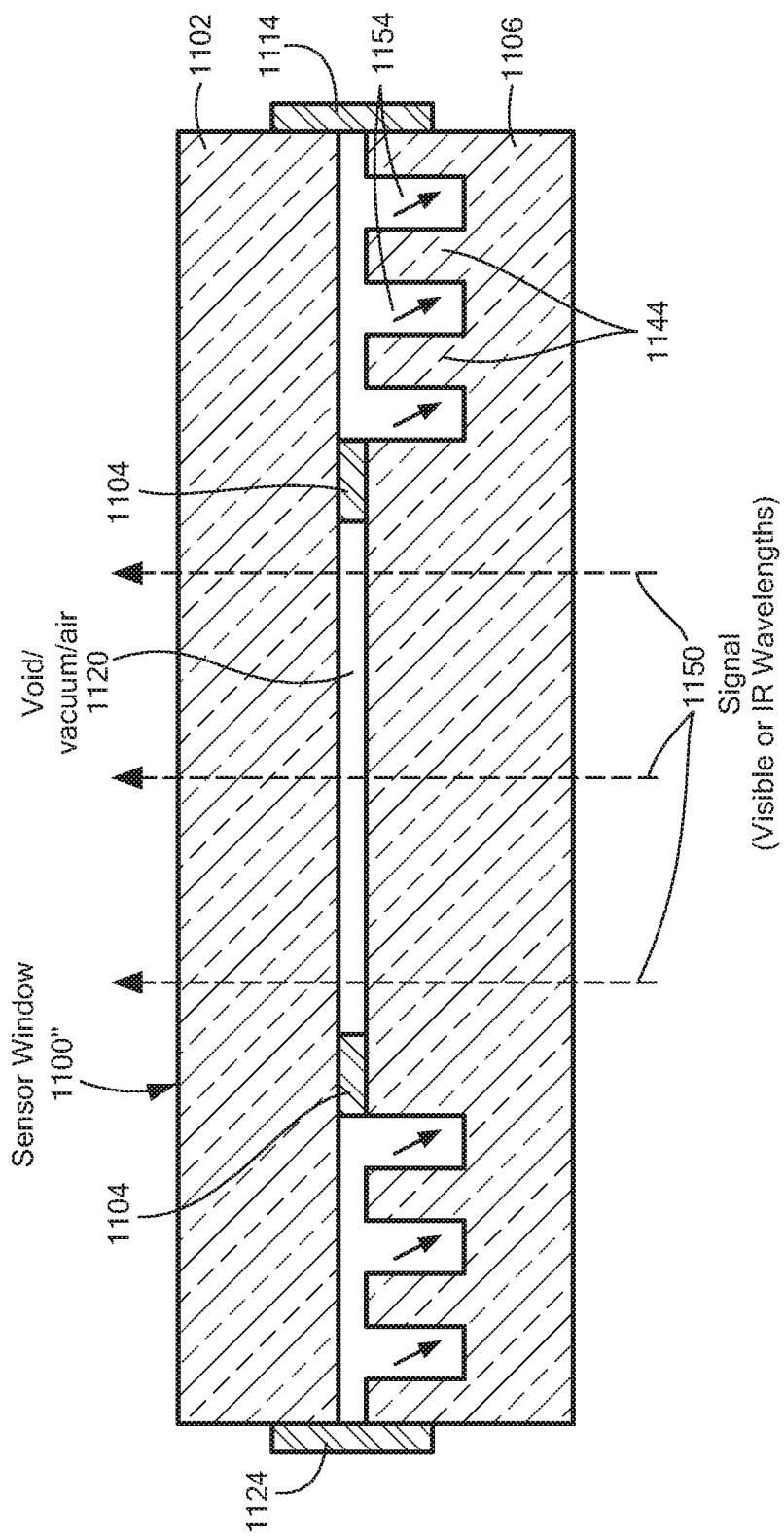

In some examples, thermal optical interfaces (e.g., thermal optical interface 1114 and thermal optical interface 1124) may be included on sides of an optical window 1100'' (FIG. 11C).

In another example, the optical windows 1100, 1100' and 1100'' may be used to reject heat due to parasitic conversion of a portion of signal energy into thermal energy within the window substrate. In yet another example, the optical windows 1100, 1100' and 1100'' may be used to cool a window that had been heated by other sources, for example, from aerodynamic friction.

Figure 12:
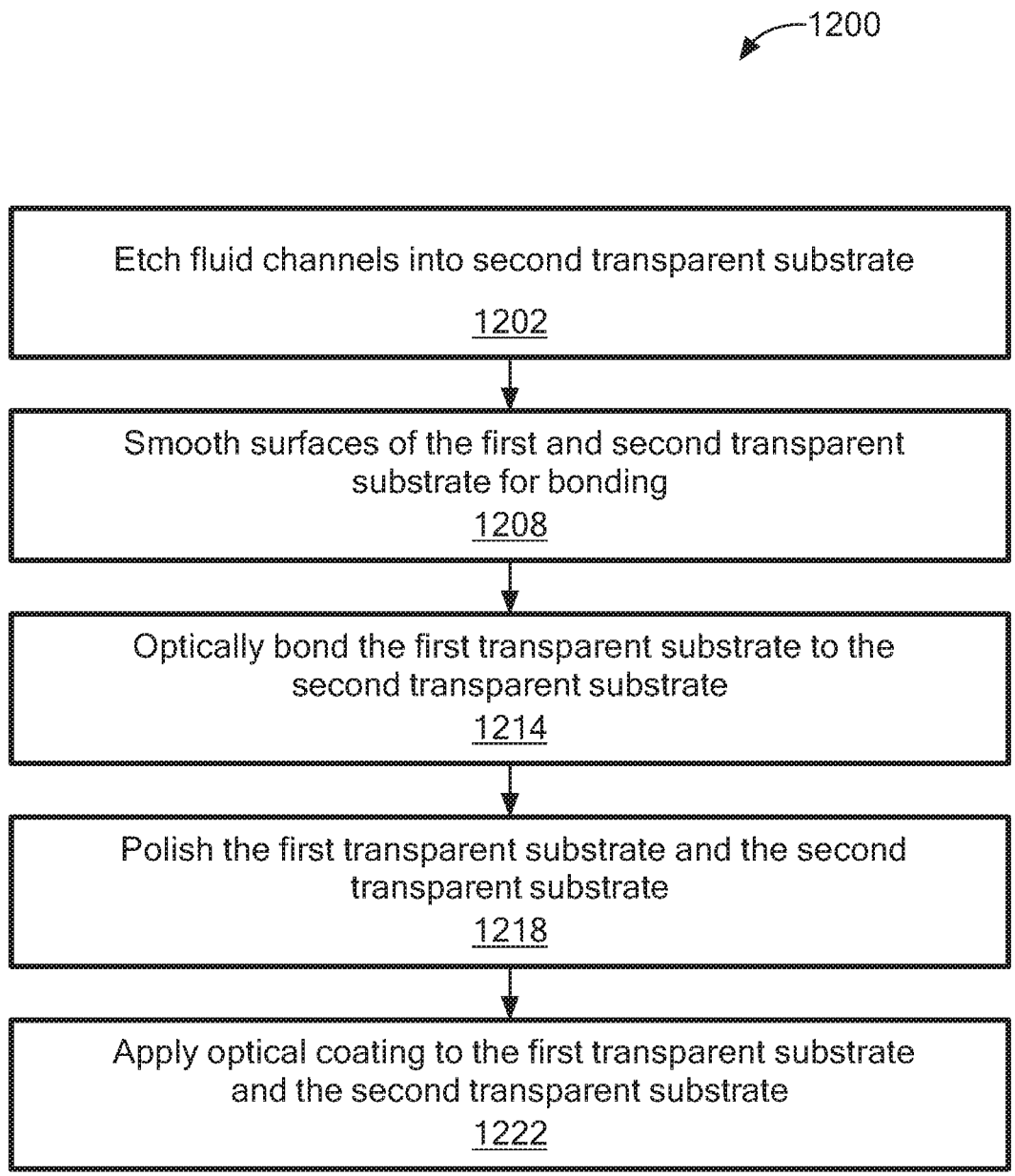
FIG. 12 is a flowchart of an example of a process to fabricate the transparent heat exchanger of FIGS. 11A to 11C.

Referring to FIG. 12, a process 1200 is an example of a process to fabricate the optical window 1100. The fluid channels 1154 are etched into the second transparent substrate 1106 (1202). Surfaces of the first and second transparent substrates 1102, 1106 are smoothed (1208). The first and second transparent substrates 1102, 1106 are optically bonded together by the bond 1104. The first and second transparent substrates 1102, 1106 are polished (1218) and coated with an optical coating (1222).

Figure 13:
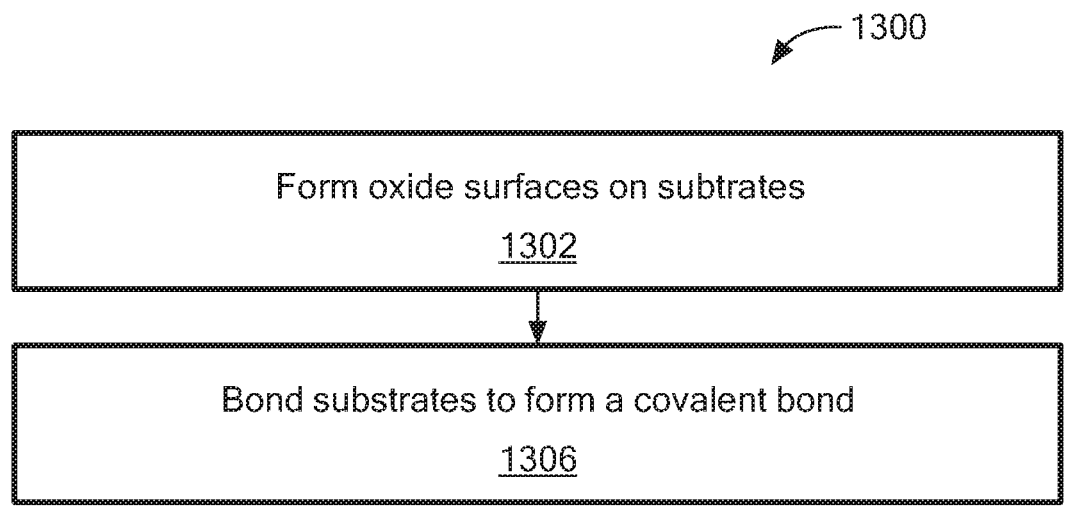
FIG. 13 is a flowchart of an example of a process to form an optical bond.

Referring to FIG. 13, a process 1300 is one example to perform optical bonding described herein in the process 400, 600, 800, 1000 and 1200. Process 1300 includes forming oxide surface on the substrates to be bonded (1302) and bonding the substrates to form a covalent bond (1306).

Figure 14:
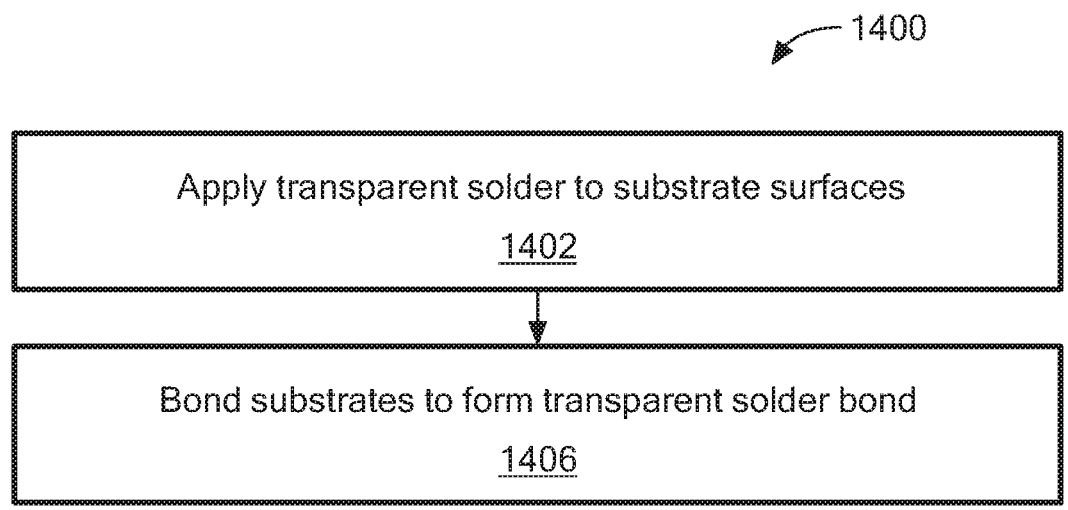
FIG. 14 is a flowchart of another example of a process to form an optical bond.

Referring to FIG. 14, a process 1400 is another example to perform optical bonding described herein in the process 400, 600, 800, 1000 and 1200 herein. Process 1400 includes applying transparent solder to substrate surfaces (1402) and bonding the substrates to form a transparent solder bond (1406).

In one example, the heat sources described herein may be from high-power laser systems. The high-power laser systems could be used in a large number of military and commercial applications. The following examples do not limit this disclosure to any particular application.

The processes described herein are not limited to the specific examples described. For example, the processes 400, 600, 800, 1000, 1200, 1300 and 1400 are not limited to the specific processing order of FIGS. 4, 6, 8, 10 and 12 to 14, respectively. Rather, any of the processing blocks of FIGS. 4, 6, 8, 10 and 12 to 14 may be re-ordered, combined or removed, performed in parallel or in serial, as necessary, to achieve the results set forth above.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:
1. A transparent heat exchanger comprising:
a first transparent substrate attached to a heat source, the first transparent substrate comprising etched troughs defining one or more fins oriented away from the heat source such that the one or more fins extend from the side of the substrate opposite to the heat source and towards a manifold to transfer heat from the heat source, the one or more fins comprising transparent material, and wherein the etched troughs are configured to carry coolant; and
the manifold comprising channels used to supply coolant to the one or more fins and to return coolant from the one or more fins, the manifold coupled to the first transparent substrate with a thermal optical interface such that the one or more fins interface with the channels.
2. The transparent heat exchanger of claim 1, wherein the manifold is bonded to the first transparent substrate.
3. The transparent heat exchanger of claim 1, further comprising a second transparent substrate.

4. The transparent heat exchanger of claim 3, wherein the second substrate is bonded to the first substrate.

5. The transparent heat exchanger of claim 3, wherein the second substrate is bonded to the manifold.

6. The transparent heat exchanger of claim 3, wherein the second transparent substrate comprises at least one of indium phosphate, silicon, silicon carbide, fused silica, sapphire, germanium, zinc selenide, zinc sulfide, diamond or any combination thereof.

7. The transparent heat exchanger of claim 1, wherein the first transparent substrate comprises at least one of indium phosphate, silicon, silicon carbide, fused silica, sapphire, germanium, zinc selenide, zinc sulfide, diamond or any combination thereof.

8. The transparent heat exchanger of claim 1, wherein a coefficient of thermal expansion (CTE) of the first transparent substrate and the CTE of the heat source are about equal.

9. The transparent heat exchanger of claim 1, wherein the manifold is along one or both ends of the first transparent substrate.

10. The transparent heat exchanger of claim 1, wherein the manifold is partially or wholly surrounds the first transparent substrate.

11. A method to cool a heat source, comprising:

attaching a transparent heat exchanger to the heat source, wherein the transparent heat exchanger includes:

a first transparent substrate attached to the heat source, the first transparent substrate comprising etched troughs defining one or more fins oriented away from the heat source such that the one or more fins extend from the side of the substrate opposite to the heat source and towards a manifold to transfer heat from the heat source to a coolant in contact with the one or more fins, the one or more fins comprising transparent material and wherein the etched troughs are configured to carry coolant, and the manifold comprising channels used to supply the coolant to the one or more fins and to return the coolant from the one or more fins, the manifold coupled to the first transparent substrate with a thermal optical interface such that the one or more fins interface with the channels.

* * * * *